(12) United States Patent
Oh et al.

(10) Patent No.: US 10,211,377 B2
(45) Date of Patent: Feb. 19, 2019

(54) METHOD FOR MANUFACTURING LIGHT-EMITTING DIODE PACKAGE

(71) Applicant: Corning Precision Materials Co., Ltd., Chungcheongnam-do (KR)

(72) Inventors: Yoon Seuk Oh, Chungcheongnam-do (KR); Ki Yeon Lee, Chungcheongnam-do (KR); Hyung Soo Moon, Chungcheongnam-do (KR); Bo Mi Kim, Chungcheongnam-do (KR); Jhee Mann Kim, Chungcheongnam-do (KR); Cheol Min Park, Chungcheongnam-do (KR); Choon Bong Yang, Chungcheongnam-do (KR)

(73) Assignee: Corning Precision Materials Co., Ltd. (KR)

(*) Notice: Subject to any disclaimer, the term of this patent is extended or adjusted under 35 U.S.C. 154(b) by 0 days.

(21) Appl. No.: 15/311,324

(22) PCT Filed: Mar. 25, 2015

(86) PCT No.: PCT/KR2015/002909
§ 371 (c)(1),
(2) Date: Nov. 15, 2016

(87) PCT Pub. No.: WO2015/174630
PCT Pub. Date: Nov. 19, 2015

(65) Prior Publication Data
US 2017/0077363 A1   Mar. 16, 2017

(30) Foreign Application Priority Data

May 16, 2014 (KR) ........................ 10-2014-0058984

(51) Int. Cl.
*H01L 21/00* (2006.01)
*H01L 33/50* (2010.01)
*H01L 33/62* (2010.01)

(52) U.S. Cl.
CPC ............ *H01L 33/507* (2013.01); *H01L 33/50* (2013.01); *H01L 33/501* (2013.01); *H01L 33/62* (2013.01);
(Continued)

(58) Field of Classification Search
CPC ... H01L 2224/16225; H01L 2933/0041; H01L 2933/0066; H01L 33/50; H01L 33/501;
(Continued)

(56) References Cited

U.S. PATENT DOCUMENTS 3,371,001 A * 2/1968 Ettre ..................... H01L 23/291
156/234
4,197,104 A * 4/1980 Krystyniak ......... C03B 19/1005
149/123
(Continued)

FOREIGN PATENT DOCUMENTS

JP   2009234056 A   10/2009
JP   2013001792 A   1/2013
(Continued)

OTHER PUBLICATIONS

Jensen, T., "PSA Tapes Offer Environmental Advantages in Packaging", Pressure Sensitive Tape Council, Sep. 1992.*
(Continued)

*Primary Examiner* — Duy T Nguyen
(74) *Attorney, Agent, or Firm* — Lerner, David, Littenberg, Krumholz & Mentlik, LLP (57) ABSTRACT

The present invention relates to a method for manufacturing a light-emitting diode package, and more specifically to a method for manufacturing a light-emitting diode package
(Continued)

that does not need an additional color conversion frit heat-treatment process and cutting process after bonding between the color conversion frit and a light-emitting diode chip. To this end, the present invention provides a method for manufacturing a light-emitting diode package characterized in that the present invention comprises: a color conversion frit formation step for forming a color conversion frit in which phosphor is included on a substrate; a color conversion frit transcription step for transcribing the color conversion frit formed on the substrate from the substrate to a transcription film; and a color conversion frit bonding step for bonding the color conversion frit transcribed on the transcription film onto a light-emitting diode package.

6 Claims, 5 Drawing Sheets

(52) U.S. Cl.
CPC ............... *H01L 2224/16225* (2013.01); *H01L 2933/0041* (2013.01); *H01L 2933/0066* (2013.01)

(58) Field of Classification Search
CPC ..... H01L 33/507; H01L 33/62; H01L 33/502; H01L 33/504; H01L 33/505; H01L 33/508
USPC .................................. 438/22, 27, 29; 257/98
See application file for complete search history.

(56) References Cited

U.S. PATENT DOCUMENTS

| | | | |
|---|---|---|---|
| 2003/0113509 A1* | 6/2003 | Lugg | B24B 37/046 428/137 |
| 2009/0142876 A1* | 6/2009 | Tuan | C09K 11/06 438/70 |
| 2010/0117511 A1* | 5/2010 | Kawakami | H01L 33/501 313/483 |
| 2011/0001159 A1* | 1/2011 | Nakamura | B82Y 20/00 257/98 |
| 2012/0241797 A1* | 9/2012 | Kim | H01L 33/505 257/98 |
| 2013/0026461 A1 | 1/2013 | Nakamura | |
| 2013/0256598 A1* | 10/2013 | Aitken | C03C 4/12 252/301.4 P |

FOREIGN PATENT DOCUMENTS

| | | | |
|---|---|---|---|
| KR | 20110040519 A | 4/2011 | |
| KR | 20130077867 A | 7/2013 | |
| WO | WO-2004-107829 A2 * | 12/2004 | ......... B81C 1/00269 |

OTHER PUBLICATIONS

International Search Report for PCT/KR2015/002909 dated Jul. 2, 2015.

* cited by examiner

FIG. 8

METHOD FOR MANUFACTURING LIGHT-EMITTING DIODE PACKAGE

CROSS-REFERENCE TO RELATED APPLICATION

This application is a national phase entry under 35 U.S.C. § 371 of International Application No. PCT/KR2015/002909, filed Mar. 25, 2015, published in Korean, which claims priority to Korean Patent Application No. 10-2014-0058984, filed on May 16, 2014, the disclosures of which are incorporated herein by reference.

BACKGROUND OF THE INVENTION

Field of the Invention

The present invention relates to a method of fabricating a light-emitting diode (LED) package. More particularly, the present invention relates to a method of fabricating an LED package that does not require an additional heat treatment or cutting process on a color conversion frit after bonding the color conversion frit to an LED chip.

Description of Related Art

A light emitting diode (LED) is a semiconductor device formed of a compound such as gallium arsenide (GaAs) to emit light in response to an electrical current applied thereto. The LED uses a p-n junction semiconductor structure into which minority carriers, such as electrons or holes, are injected, such that light is generated by the recombination of electrons and holes.

The characteristics of LEDs include low power consumption, a relatively long lifespan, the ability to be mounted in cramped spaces, and strong resistance to vibrations. While LEDs are used in display devices and the backlight units of display devices, studies into applying LEDs to general lighting devices have been recently undertaken. In addition to monochromatic LEDs, such as red, blue, or green LEDs, white LEDs have also come onto the market. In particular, a sharp increase in demand for white LEDs is expected, since white LEDs can be applied to vehicle lighting devices and general lighting apparatuses.

In the field of LED technology, white light is commonly generated using two main methods. The first method to generate white light includes disposing monochromatic LEDs, such as red, green, and blue LEDs, adjacently to each other such that various colors of light emitted by the monochromatic LEDs are mixed. However, color tones may change depending on the environment in which such devices are used, since individual monochromatic LEDs have different thermal or temporal characteristics. In particular, color stains may occur, making it difficult to uniformly mix different colors of light. The second method to generate white light includes applying a fluorescent material to surfaces of an LED and mixing a portion of light initially emitted by the LED and secondary light wavelength-converted by the fluorescent material. For example, a fluorescent material generating yellowish-green or yellow light may be used as a light excitation source on a blue LED, whereby white light can be produced by mixing blue light emitted by the blue LED and yellowish-green or yellow excitation light from the fluorescent material. At present, the second method of realizing white light utilizing a blue LED and a fluorescent material is generally used.

The fluorescent material for producing white light in cooperation with the blue LED chip can be used mixed with a frit. In the related art, in order to directly bond the mixture of the frit and the fluorescent material to the LED chip, the mixture of the frit and the fluorescent material has been formed into a paste, followed by coating the LED chip with the mixture of the frit and the fluorescent material and subsequent sintering. However, the sintering temperature is commonly 500° C. or above, and the LED chip that is thermally stable at 200° C. or below cannot withstand such a sintering temperature. That is, sintering the mixture of the frit and the fluorescent material at such a temperature will degrade LED chips, which is problematic. In addition, a heat treatment, such as sintering, performed after the operation of coating the LED chip with the mixture of the frit and the fluorescent material may cause a problem. For example, a base substrate, i.e. a GaN substrate, on which a plurality of LEDs is formed, may be warped. When a GaN substrate is warped in this manner, none of the plurality of LED chips formed on the GaN substrate can be used. Although a fluorescent mixture able to be sintered at a low temperature may be used in order to overcome the degradation problem, other problems, such as peeling or fracturing, may occur in the process of cutting the plurality of LED chips.

Related Art Document

Patent Document 1: United States Patent Application Publication No. US2013/0026461 (Jan. 31, 2013)

BRIEF SUMMARY OF THE INVENTION

Various aspects of the present invention provide a method of fabricating an LED package that does not require an additional heat treatment or cutting process on a color conversion frit after bonding the color conversion frit to a light-emitting diode (LED) chip.

According to an aspect of the present invention, a method of fabricating an LED package includes: forming a color conversion frit containing a fluorescent material on a substrate; transferring the color conversion frit formed on the substrate to a transfer film; and bonding the color conversion frit on the transfer film to an LED chip.

According to an embodiment of the present invention, the process of forming the color conversion frit may include: coating the substrate with the color conversion frit; and sintering the color conversion frit coating the substrate.

The process of coating the substrate may coat the substrate with the color conversion frit in a size corresponding to the size of the LED chip.

The process of coating the substrate may pattern the color conversion frit in a shape corresponding to the shape of a plurality of the LEDs.

The substrate may be implemented as a boron nitride substrate or a graphite substrate.

At the process of transferring the color conversion frit, the transfer film may be implemented as a pressure sensitive adhesive film.

The process of bonding the color conversion frit may bond the color conversion frit and the LED chip by means of an adhesive.

The LED chip may be implemented as a blue LED chip, and the fluorescent material may convert a portion of light emitted by the blue LED chip into yellow light.

In addition, the method may further include removing the transfer film from the color conversion frit after the process of bonding the color conversion frit to the LED chip.

Furthermore, the method may further include mounting the LED chip onto a package substrate after the process of removing the transfer film.

According to the present invention as set forth above, a substrate is coated with an intended pattern of a color conversion frit that generates white light from an LED, and the color conversion frit is sintered. Afterwards, the color conversion frit is transferred to a transfer film, and subsequently is bonded to an LED chip. Accordingly, after the color conversion frit is bonded to the LED chip, an additional heat treatment or cutting process on the color conversion frit is not required.

In other words, according to the present invention, since the process of forming the color conversion frit on the LED chips is completed with the bonding of the color conversion frit to the LED chips, it is possible to fundamentally prevent a base substrate on which the LED chips are formed from being warped by a heat treatment of the related art or cracks from occurring in the color conversion frit during a cutting operation of dividing the color conversion frit according to the LED chips. Accordingly, it is possible to simplify the process of fabricating an LED package while minimizing the occurrence of defects.

In addition, according to the present invention, it is possible to form a color conversion frit in an intended size without restriction on the size of LED chips by patterning the color conversion frit according to the size of LEDs by screen printing or spraying before bonding the color conversion frit to the LED chips.

DETAILED DESCRIPTION OF THE INVENTION

Reference will now be made in detail to a method of fabricating a light-emitting diode (LED) package according to the present invention, examples of which are illustrated in the accompanying drawings and described below, so that a person skilled in the art to which the present invention relates could easily put the present invention into practice.

Throughout this document, reference should be made to the drawings, in which the same reference numerals and symbols will be used throughout the different drawings to designate the same or like components. In the following description of the present invention, detailed descriptions of known functions and components incorporated herein will be omitted in the case that the subject matter of the present invention is rendered unclear.

Figure 1:
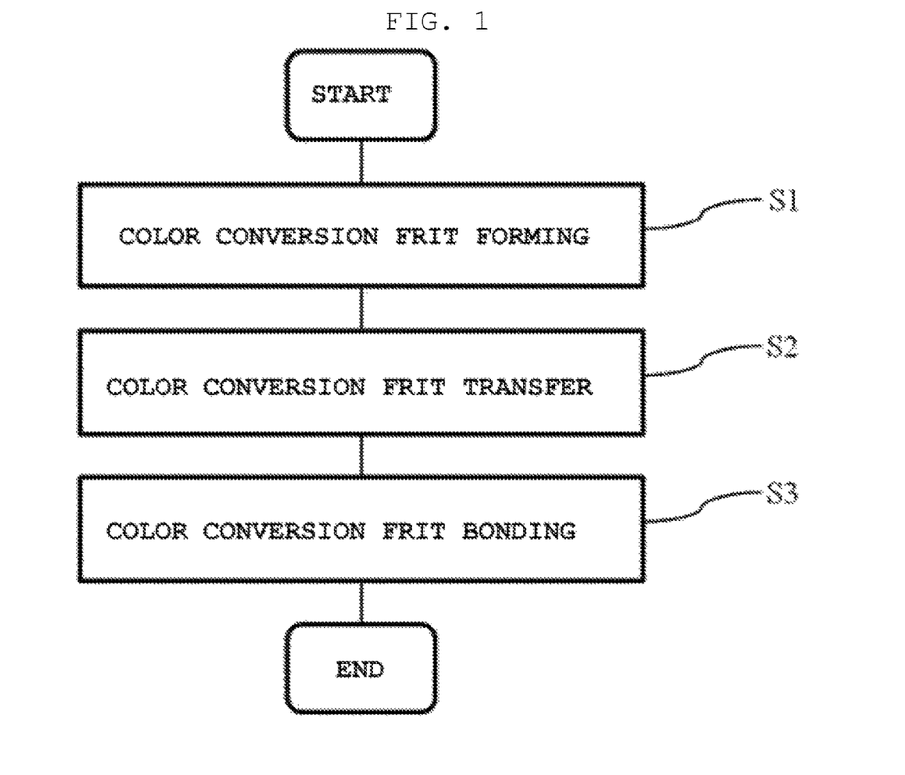
FIG. 1 is a flowchart illustrating a method of fabricating an LED package according to an exemplary embodiment of the present invention.
Figure 8:
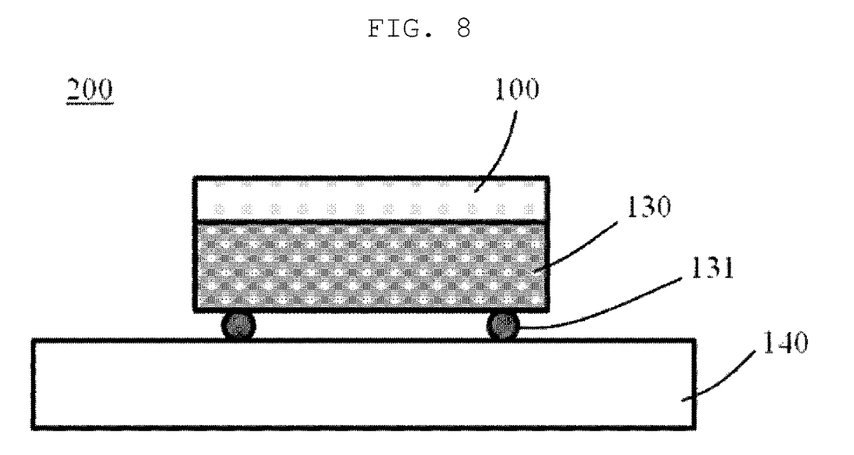

Referring to FIG. 1, a method of fabricating an LED package according to an exemplary embodiment of the present invention is a method of fabricating a white LED package (200 in FIG. 8). The method of fabricating an LED package includes color conversion frit forming step S1, color conversion frit transfer step S2, and color conversion frit bonding step S3.

Figure 2:
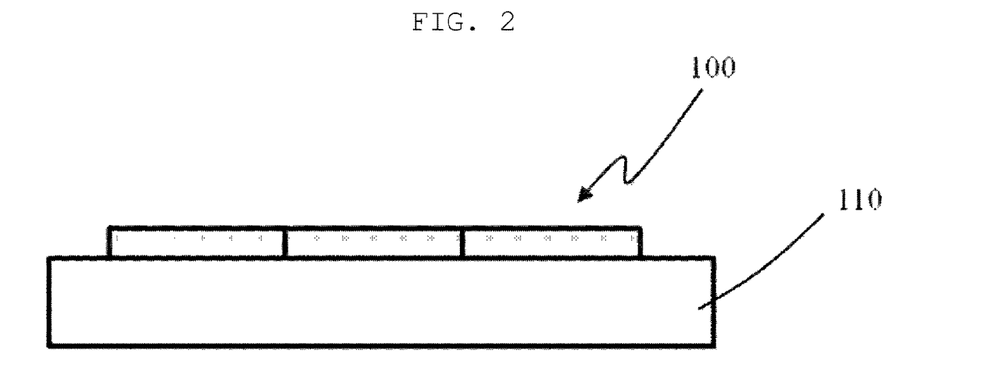
FIG. 2 to FIG. 8 are schematic views sequentially illustrating the operations in the method of fabricating an LED package according to the exemplary embodiment of the present invention.
Figure 3:
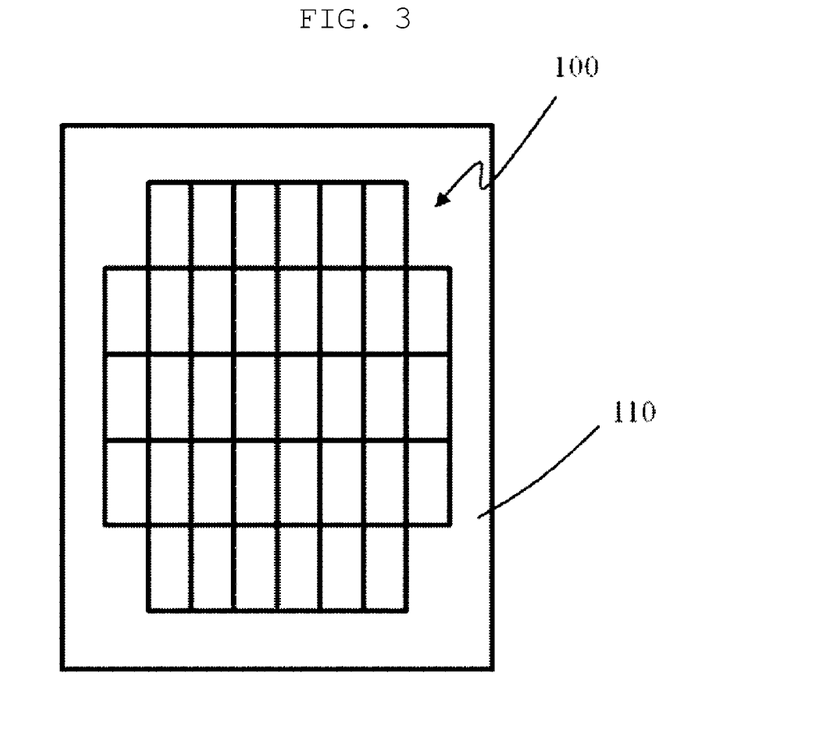

Referring to FIG. 2 and FIG. 3, the color conversion frit forming step S1 is the step of forming a color conversion frit 100 containing a fluorescent material on a substrate 110. Here, the fluorescent material is a material that generates wavelength-converted light, i.e. fluorescent light, by converting the wavelength of light emitted by an LED chip (i.e. an LED chip of a plurality of LED chips 130 illustrated in FIG. 6). According to the present embodiment, the LED chip is implemented as a blue LED. In order to generate white light by light mixing with blue light emitted by the blue LED, a fluorescent material that converts the wavelength of a portion of light emitted by the blue LED may be mixed with frit powder to form the color conversion frit 100. The fluorescent material is mixed with the frit powder, and the mixture is dispersed in a solvent, thereby forming a paste of the color conversion frit 100. It is preferable that the fluorescent material be formed of a material having superior dispersibility. In addition, it is more preferable that the fluorescent material be formed of a material having superior long-term reliability.

In order to form the color conversion frit 100 containing the fluorescent material on the substrate 110, the color conversion frit forming step S1 may include coating and sintering processes.

First, in the coating process, the substrate 110 is coated with the paste of the color conversion frit 100. In the coating process, the substrate 110 is coated with the color conversion frit 100 in a size corresponding to the size of the plurality of LED chips (130 in FIG. 6). Specifically, the substrate 110 is coated with the color conversion frit 100 in an area and shape corresponding to the top surfaces of the plurality of LED chips 130, i.e. the bonding surfaces of the plurality of LED chips 130 to which the color conversion frit 100 will be bonded in a subsequent process.

Figure 6:
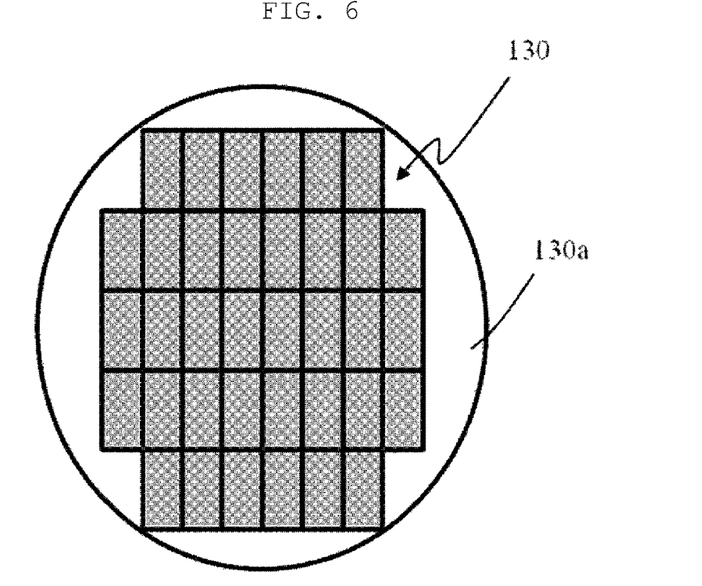

As illustrated in FIG. 6, according to the present invention, the plurality of LED chips 130 is provided on a base substrate 130a. In the coating process, the color conversion frit 100 is patterned on the substrate 110 in the shape corresponding to the shape of the plurality of LED chips 130. For example, the coating process may include preparing a mask having a pattern corresponding to the plurality of LED chips 130 and coating the substrate 110 with an intended pattern of the color conversion frit 100 using the mask. The coating may be screen printing, or may include spraying the color conversion frit 100 onto the substrate 110 after placing the mask on the substrate 110. When the color conversion frit 100 is patterned in the shape corresponding to the shape of the plurality of LED chips 130, the operation of cutting the color conversion frit 100 into unit pieces is not required in the process of cutting the plurality of LED chips 130 into individual LED chips, since the color conversion frit 100 is patterned, i.e. divided, according to each of the plurality of LED chips 130. It is therefore possible to prevent the problem of peeling or fracturing that would otherwise occur in the process of cutting a color conversion frit in the related art. In addition, since the mask can be fabricated according to the size of the plurality of LED chips 130 without restriction on the size of the LED chips 130, it is possible to form the color conversion frit 100 in an intended size.

The substrate 110 used in the formation of the color conversion frit 100 is a backing that supports the color conversion frit 100 coating the substrate 110 during the subsequent process of sintering the color conversion frit 100. According to the present embodiment, the substrate 110 may be implemented as a boron nitride (BN) substrate or a graphite substrate.

Afterwards, in the sintering process, the color conversion frit 100 coating the substrate 110 is sintered. When the manufacture of the color conversion frit 100 in the shape of a thin film or substrate is completed before the color conversion frit bonding step S3 that will proceed as a subsequent process, no heat treatment follows after the color conversion frit bonding step S3. This can consequently prevent a problem, such as degradation of the LED chips 130 or warping of the base substrate 130a on which the plurality of LED chips 130 is formed, which would otherwise be caused by the sintering heat treatment of the color conversion frit 100.

Figure 4:
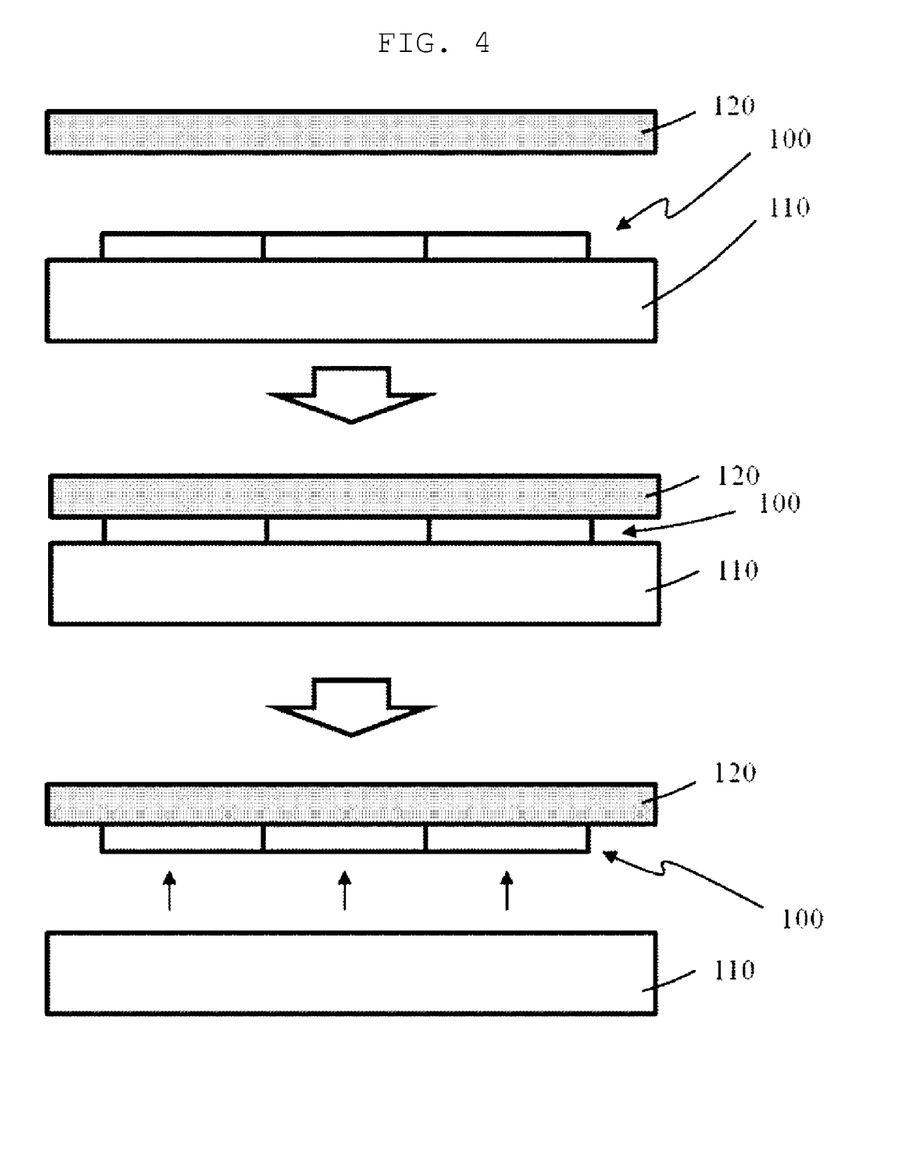
Figure 5:
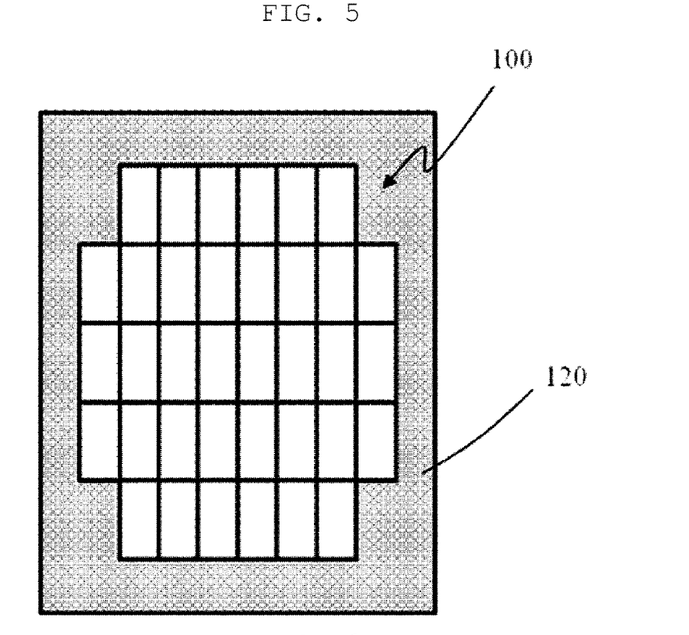

After that, referring to FIG. 4 and FIG. 5, the color conversion frit transfer step S2 is the step of transferring the color conversion frit 100 formed on the substrate 110 to a transfer film 120. Specifically, at the color conversion frit transfer step S2, the transfer film 120 is placed above the color conversion frit 100 formed on the substrate 110, is moved downwardly such that the transfer film 120 comes into contact with the color conversion frit 100, and subsequently the transfer film 120 is moved upwardly. In order to improve the ratio of the transfer of the color conversion frit 100 to the transfer film 120, the transfer film 120 may be heated or rubbed with a roller while the transfer film 120 is kept in contact with the color conversion frit 100.

Through this process, the color conversion frit 100 formed on the substrate 110 is removed from the surface of the substrate 110, and is transferred to the surface of the transfer film 120 in the shape formed on the substrate 110. According to the present embodiment, the transfer film 120 for transferring the color conversion frit 100 may be implemented as a pressure sensitive adhesive (PSA) film.

Thereafter, the color conversion frit bonding step S3 is the step of bonding the color conversion frit 100 transferred to the transfer film 120 to the plurality LED chips 130. At the color conversion frit bonding step S3, the color conversion frit 100 is bonded to the plurality LED chips 130 by means of an adhesive. Specifically, after the adhesive is applied to the bonding surfaces of the plurality LED chips 130, the color conversion frit 100 is bonded to the applied adhesive.

As illustrated in FIG. 6, the plurality LED chips 130 provided according to the present embodiment may be formed on the base substrate 130a formed as a GaN substrate. Each of the plurality LED chips 130 is a light source emitting light in response to current applied thereto, formed as a forward junction of an n-semiconductor layer that provides electrons and a p-semiconductor layer that provides holes. In addition, the LED chip 130 provided according to the present embodiment is implemented as a blue LED to emit blue light. A portion of the emitted blue light is wavelength-converted into yellow light by the fluorescent material contained in the color conversion frit 100 disposed on a path along which the light radiates outward. That is, an LED package (200 in FIG. 8) fabricated according to the present embodiment generates white light by mixing the blue light emitted by the blue LED chip 130 with the yellow light wavelength-converted by the fluorescent material contained in the color conversion frit 100. In addition, the LED chip 130 provided according to the present embodiment may be implemented as a flip chip. Accordingly, the LED chip 130 may have electrodes (131 in FIG. 8) or an electrode pattern formed on the bottom thereof. The electrodes (131 in FIG. 8) or an electrode pattern will be fused to a package substrate (140 in FIG. 8) implemented as a printed circuit board (PCB) to electrically connect the LED chip 130 to the package substrate (140 in FIG. 8).

Figure 7:
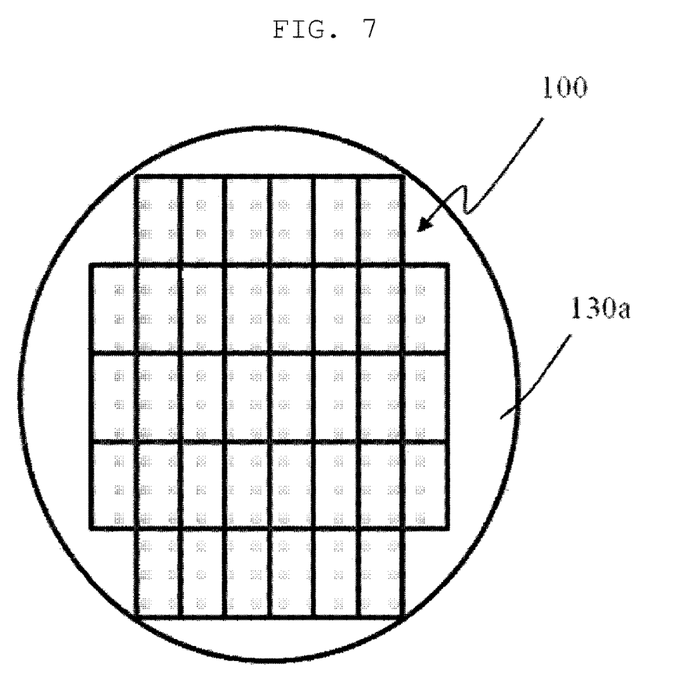

Referring to FIG. 7, after the color conversion frit 100 is bonded to the plurality of LED chips 130 through the color conversion frit bonding step S3, the process of removing the transfer film from the color conversion frit 100 may be performed.

Finally, referring to FIG. 8, after the transfer film 120 is removed from the color conversion frit 100, the plurality of LED chips 130 is cut into a plurality of unit cells each of which is based on a single LED chip 130. Subsequently, the LED chip 130 is mounted onto the package substrate 140 by fusing the electrodes 131 formed on the bottom of the LED chip 130 to electrode portions of the package substrate 140. Consequently, the fabrication of an LED package 200 according to the present embodiment is completed.

According to the method of fabricating an LED package according to present embodiment as set forth above, the substrate 110 is coated with the color conversion frit 100 in an intended pattern, the coated color conversion frit 100 is sintered, the color conversion frit 100 is transferred to the transfer film 120, and subsequently the color conversion frit 100 transferred to the transfer film 120 is bonded to the LED chip 130. After these processes, an additional heat treatment or cutting process is not performed on the color conversion frit 100. It is therefore possible to prevent the heat treatment from degrading the LED chip 130 or the cutting from causing cracks in the color conversion frit 100. Accordingly, the method of fabricating an LED package according to the present invention can simplify the fabrication of the LED package 200 and minimize the occurrence of defects.

The foregoing descriptions of specific exemplary embodiments of the present invention have been presented with respect to the drawings. They are not intended to be exhaustive or to limit the present invention to the precise forms disclosed, and obviously many modifications and variations are possible for a person having ordinary skill in the art in light of the above teachings.

It is intended therefore that the scope of the present invention not be limited to the foregoing embodiments, but be defined by the Claims appended hereto and their equivalents.

EXPLANATION OF REFERENCE NUMERALS

100: color conversion frit, 111; substrate
120: transfer film, 130: LED chip
131: electrode, 130a: base substrate
140: package substrate, 200: LED package

What is claimed is:

1. A method of fabricating a light-emitting diode package comprising:
    forming a color conversion frit containing a fluorescent material on a substrate;
    transferring the color conversion frit formed on the substrate to a transfer film, thereby separating the color conversion frit from the substrate; and
    bonding the color conversion frit on the transfer film to a light-emitting diode chip,
    wherein forming the color conversion frit comprises:
        coating the substrate with the color conversion frit; and
        sintering the color conversion frit coating the substrate,
    wherein the transfer film comprises a pressure sensitive adhesive film,
    wherein coating the substrate comprises coating the substrate with the color conversion frit in a size corresponding to a size of the light-emitting diode chip,
    wherein coating the substrate comprises patterning the color conversion frit in a shape corresponding to a shape of a plurality of the light-emitting diode chips.

2. The method according to claim 1, wherein the substrate comprises a boron nitride substrate or a graphite substrate.

3. The method according to claim 1, wherein bonding the color conversion frit comprises bonding the color conversion frit and the light-emitting diode chip together by means of an adhesive.

4. The method according to claim 1, wherein the light-emitting diode chip comprises a blue light-emitting diode chip, and the fluorescent material converts a portion of light emitted by the blue light-emitting diode chip into yellow light.

5. The method according to claim 1, further comprising removing the transfer film from the color conversion frit after bonding the color conversion frit to the light-emitting diode chip.

6. The method according to claim 5, further comprising mounting the light-emitting diode chip onto a package substrate after removing the transfer film.

* * * * *